(12) United States Patent
Grizzi et al.

(10) Patent No.: US 8,232,548 B2
(45) Date of Patent: Jul. 31, 2012

(54) LIGHT-EMISSIVE DEVICE

(75) Inventors: Ilaria Lavinia Grizzi, Cambridge (GB); Peter Lyon, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 12/703,457

(22) Filed: Feb. 10, 2010

(65) Prior Publication Data

US 2010/0155667 A1  Jun. 24, 2010

Related U.S. Application Data

(60) Division of application No. 11/339,361, filed on Jan. 25, 2006, now Pat. No. 7,687,287, which is a continuation of application No. 10/362,431, filed as application No. PCT/GB01/00852 on Feb. 28, 2001, now Pat. No. 7,023,012.

(30) Foreign Application Priority Data

Aug. 30, 2000  (WO) .............. PCT/GB00/03349

(51) Int. Cl.
   *H01L 35/24*  (2006.01)
(52) U.S. Cl. ............... 257/40; 257/98; 257/E51.001
(58) Field of Classification Search .......... 257/40, 257/98
   See application file for complete search history.

(56) References Cited

U.S. PATENT DOCUMENTS

| | | | |
|---|---|---|---|
| 4,448,956 A | 5/1984 | Lenke et al. | |
| 4,539,507 A | 9/1985 | VanSlyke et al. | |
| 5,247,190 A | 9/1993 | Friend et al. | |
| 5,777,070 A | 7/1998 | Inbaskekaran et al. | |
| 5,820,932 A * | 10/1998 | Hallman et al. | 427/261 |
| 5,849,443 A | 12/1998 | Visser et al. | |
| 5,912,473 A | 6/1999 | Hotta et al. | |
| 5,976,419 A * | 11/1999 | Hawkins et al. | 252/512 |
| 6,582,504 B1 * | 6/2003 | Fujita | 106/311 |
| 6,762,234 B2 | 7/2004 | Grizzi | |
| 7,023,012 B2 | 4/2006 | Grzzi et al. | |
| 7,687,287 B2 | 3/2010 | Grzzi et al. | |

FOREIGN PATENT DOCUMENTS

| | | |
|---|---|---|
| EP | 0609478 A1 | 8/1994 |
| EP | 707022 | 4/1996 |
| EP | 0825242 A2 | 2/1998 |
| EP | 0923083 A1 | 6/1999 |
| EP | 0880303 A1 | 3/2001 |
| EP | 1083775 | 3/2001 |

(Continued)

OTHER PUBLICATIONS

Chandrasekhar, Conducting Polymers, Fundamentals and Applications, A Practical Approach, Kluwer Academic Publishers Boston, 1999, pp. 23-41 and 454-459.*

(Continued)

Primary Examiner — Thanh Nguyen
(74) Attorney, Agent, or Firm — DLA Piper LLP (US)

(57) ABSTRACT

A light-emissive device is prepared by depositing a polymer layer on a substrate. The deposition process utilizes a formulation comprising a conjugated polymer dissolved in a solvent, the solvent including a trialkyl-substituted aromatic hydrocarbon wherein at least two of the alkyl substituents are ortho to one another. The deposition of the polymer layer on the substrate may be accomplished by an ink-jet method.

14 Claims, 2 Drawing Sheets

FOREIGN PATENT DOCUMENTS

| | | | |
|---|---|---|---|
| GB | 2102010 A | 1/1983 | |
| GB | 2161822 | 1/1986 | |
| GB | 2336553 | 10/1999 | |
| JP | 03-007715 A | * 1/1991 | |
| JP | 03007715 A | 1/1991 | |
| JP | 11224779 | 8/1998 | |
| JP | 2001052861 A | 2/2001 | |
| JP | 2001155861 | 6/2001 | |
| JP | 2002056980 | 2/2002 | |
| WO | 9912398 | 3/1999 | |
| WO | 9913692 | 3/1999 | |
| WO | 9954385 | 10/1999 | |

OTHER PUBLICATIONS

Nonlinear Optics, 1999, vol. pp. 269-295, "Thermally Stable Poly(flourene) Copolymers for Blue-Light Emission" R.D. Miller, et al. IBM Research Division, Almaden Research Cent.

Chandrasekhar, Conducting Polymers, Fundamentals and Applications, A Practical Approach, Kluwer Academic Publishers: Boston, 1999, pp. 23-41 and 454-459.

* cited by examiner

LIGHT-EMISSIVE DEVICE

CROSS-REFERENCE TO RELATED APPLICATIONS

This application is a division of application Ser. No. 11/339,361 filed Jan. 25, 2006, now U.S. Pat. No. 7,687,287, which was a continuation of application Ser. No. 10/362,431 filed Jul. 29, 2003, now U.S. Pat. No. 7,023,012, claiming the priority of PCT/GB01/00852 filed Feb. 28, 2001, and entitled: "Formulation for depositing a conjugated polymer layer," which claims the benefit of Application No. PCT/GB00/03349, filed Aug. 30, 2000.

The present invention relates to a formulation for depositing a conjugated polymer layer in a light-emissive device (LED).

Light-emissive devices using as the light-emissive layer a semiconductive conjugated polymer are known. FIG. 1 shows the construction of a simple light-emissive device. A glass or plastics substrate 2 is coated with an anode layer 4, for example in the form of indium in oxide. The anode can be patterned in the form of elongate strips. The anode layer may be coated with a hole transport layer. A light-emissive polymer layer 6 is then deposited followed by the deposition of an electron transport layer. The device structure is then completed by the deposition of a cathode layer 8. By way of example, the cathode layer can be calcium or aluminium. The cathode layer 8 can be patterned in crosswise strips to define pixels P where the anode and cathode overlap. Alternatively with an unpatterned cathode, light emissive strips can be defined. Further alternatively, the pixels may be defined on an active matrix back-plane and the cathode may be patterned or unpatterned. When an electric field is applied between the anode and cathode, holes and electrons are injected into the light-emissive polymer layer 6. The holes and electrons recombine in the polymer layer and a proportion decay radiatively to generate light.

The hole transport layer can be comprised generally of any compound capable of sustaining hole transport. Examples of suitable materials are organic conductors such as the following conducting polymers: polyaniline, polyethylenedioxythiophene and other polythiophenes, polypyrrole, etc. in their doped forms. Other alternative materials are conjugated polyamines and also low molecular weight amines such as TPD.

The light-emissive layer may comprise any molecular or polymeric compounds which are capable of sustaining charge carrier transport and also capable of light emission under device driving conditions. Examples include fluorescent organic compounds and conjugated polymers such as Alq3, polyphenylenes and derivatives, polyfluorenes and derivatives, polythiophenes and derivatives, polyphenylene vinylenes and derivatives, polymers containing heteroaromatic rings, etc.

The electron transport layer may generally comprise any material capable of sustaining electron transport. Examples include perylene systems, Alq3, polyfluorenes or polyfluorene copolymers, polymers containing heteroaromatic rings, etc.

The device may contain any combination of the above layers provided it includes at least one light-emissive layer.

OLEDs are described in U.S. Pat. No. 5,247,190 or in U.S. Pat. No. 4,539,507, the contents of which are incorporated herein by reference. In U.S. Pat. No. 5,247,190 the active organic layer is a light-emissive semiconductive conjugated polymer and in U.S. Pat. No. 4,539,507 the active organic layer is a light-emissive sublimed molecular film.

Conventionally, the polymer layer was typically deposited by spin-coating or metered blade-coating a polymer solution onto the anode and then either allowing the solvent to evaporate at RTP, or driving off the solvent using heat treatment and/or reduced pressure. The polymer was the light-emissive polymer itself cast directly from solution, or a precursor to the polymer, which is converted to the light-emissive polymer during a heat treatment step. The polymer layer can comprise a blend of two or more materials, such as a blend of two or more polymers.

The polymer layer(s) may also be deposited by supplying a solution-processible material including the polymer through a plurality of elongate bores, either through the effect of gravity or under pressure or utilising the effect of surface tension. This facilitates direct deposition or patterning of the polymer films as required.

Deposition of the polymer layer(s) by means of an ink-jet method is a particularly preferred technique. The ink-jet method is described, for example, in EP0880303A1, the content of which is incorporated herein by reference.

It is desirable to use material formulations with which thin polymer films exhibiting excellent emission uniformity can be produced.

The present applicant's own previous application PCT/GB00/03349 discloses examples of formulations for depositing conjugated polymers based on polyalkylated benzenes such as cymene and isodurene.

It is also an aim of the present invention to provide formulations that facilitate the direct deposition of patterned polymer films. In particular, it is an aim of the present invention to provide a formulation with which conjugated polymer films that exhibit improved emission uniformity can be deposited.

According to a first aspect of the present invention, there is provided a formulation for depositing a polymer layer in the production of a light-emissive device, the formulation including a conjugated polymer dissolved in a solvent, the solvent including a dialkyl- or trialkyl-substituted aromatic hydrocarbon, at least two of the alkyl substituents being ortho to one another.

The solvent preferably includes one or more of 1,2-dimethyl benzene, 1,2,3-trialkylbenzene and 1,2,4-trialkylbenzene. 1,2-dimethyl benzene and 1,2,3-trialkylbenzene are particularly preferred.

According to a second aspect of the present invention, there is provided a formulation for depositing a polymer layer in the production of a light-emissive device, the formulation including a conjugated polymer dissolved in a solvent, the solvent including a trialkylbenzene.

According to a third aspect of the present invention there is provided a method of depositing a polymer layer by supplying a solution processible formulation according to the first or second aspects of the present invention via a plurality of elongate bores onto a substrate.

According to a fourth aspect of the present invention, there is provided a method of forming a polymer layer on a substrate comprising the step of depositing a formulation according to the first or second aspects of the present invention on a substrate by an ink-jet method.

For the purposes of this application, the term "polymer" includes homopolymers and copolymers, and also includes layers of polymer blends as well as layers of single polymers; and the term "polymer layer" includes a layer of relatively small dimensions, such as a layer having dimensions corresponding to a single pixel in a pixelated display, as well as layers of larger dimensions.

For the purposes of this application, the term "alkyl" refers to linear or branched alkyl substituents having up to 6 carbon atoms.

The resulting formulation preferably has a surface tension in the range of 25 to 40 mN/m at 20° C., a viscosity of 2 to 8 cPs at 20° C., and a w/v polymer concentration of 0.25 to 1.5%, preferably 0.5 to 1%. A formulation having such properties is particularly suited for deposition by ink-jet printing. The formulation should also have a contact angle appropriate for the substrate on which the deposition is carried out. For example, in the case of a polyimide substrate, the contact angle should be in the range of 30 to 60 degrees.

The formulation may include one or more additional types of solvents provided that the resulting formulation has the necessary fluid properties for the particular deposition technique. The presence of even a relatively small proportion of, for example, one or more trialkyl benzenes in the formulation can serve to improve the stability of the formulation and/or the fluid properties of the formulation.

For the purposes of this application, the term conjugated polymer refers to polymers, including oligomers such as dimers, trimers etc., which are fully conjugated (i.e. are conjugated along the entire length of the polymer chain) or are partially conjugated (i.e. which include non-conjugated segments in addition to conjugated segments).

The polymer may have an average molecular weight in the range of 10,000 to 500,000, more particularly in the range of 10,000 to 300,000.

The polymer may be a polymer suitable for use in a light-emissive layer, a hole transport layer or an electron transport layer in an organic light-emissive device.

In a preferred example, the conjugated polymer can be a light-emissive polymer, hole transport polymer or electron transport polymer itself, or a precursor to a light-emissive polymer, hole transport polymer or electron transport polymer. The conjugated polymer or its precursor can be any suitable polymer, and in particular can be any one of the following:

a) conducting polymers such as polyaniline (PANI) and derivatives, polythiophenes and derivatives, polypyrrole and derivatives, polyethylene dioxythiophene; doped forms of all these and particularly polystyrene sulphonic acid-doped polyethylene dioxythiophene (PEDT/PSS);

b) solution processible charge transporting and/or luminescent/electro-luminescent polymers, preferably conjugated polymers such as: polyphenylenes and derivatives, polyphenylene vinylenes and derivatives, polyfluorenes and derivatives, tri-aryl containing polymers and derivatives, precursor polymers in various forms, copolymers (including the above-named polymer classes), generally random and block copolymers, polymers with the active (charge transporting and/or luminescent) species attached as side-groups to the main chain, thiophenes and derivatives, etc.

It is also envisaged that the present invention is also applicable to formulations comprising other compounds such as solution processible molecular compounds including spiro-compounds, such as described for example in EP-A0676461; and other inorganic compounds, e.g. solution-processible organometallic precursor compounds to fabricate insulators or conductors.

The conjugated polymer may, for example, comprise a fluorene-based polymer, or a copolymer containing fluorene units with other units such as triarylamine units or benzylthiadiazole (BT) units, or a blend of two or more of such polymers.

BRIEF DESCRIPTION OF THE DRAWINGS

For a better understanding of the invention and to show how the same may be carried into effect, embodiments of the present invention are described hereunder, by way of example only, with reference to the accompanying drawings in which.

DETAILED DESCRIPTION

Figure 1:
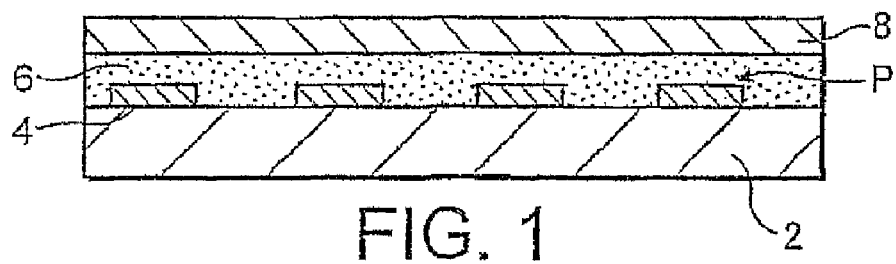
FIG. 1 is a diagram of a light-emissive device.
Figure 2:
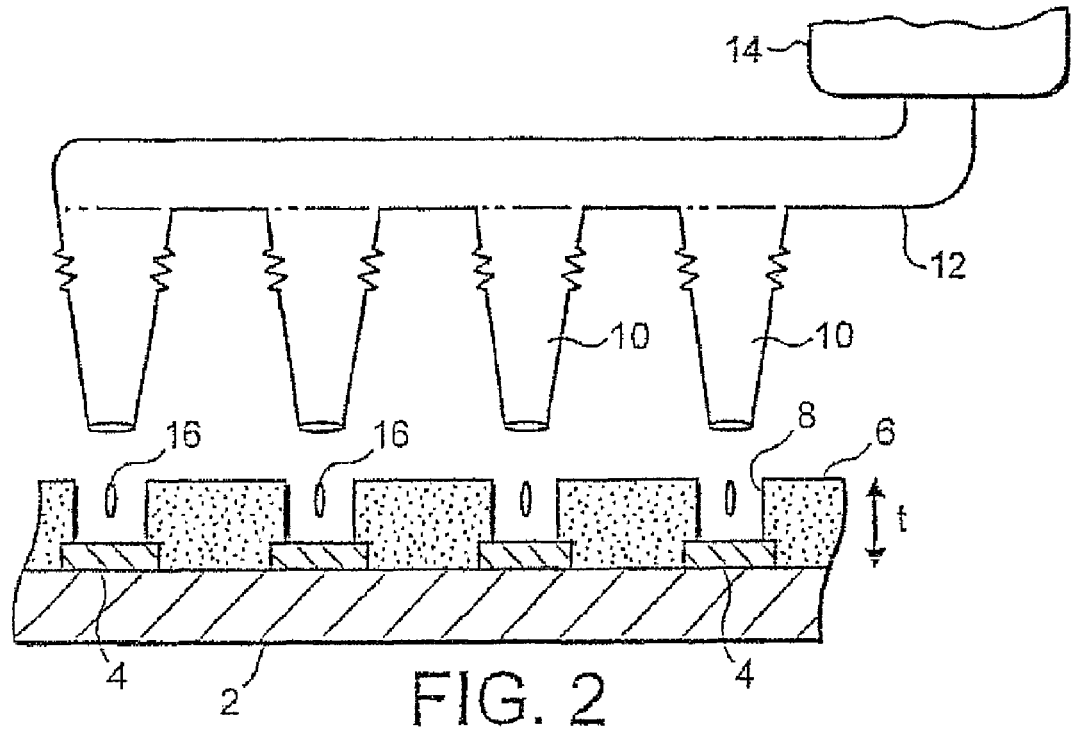
FIG. 2 is a diagram illustrating a method of depositing various polymer layers.

FIG. 2 illustrates a deposition technique for depositing a polymer layer 6 onto the patterned anode 4. A plurality of elongate bores 10 are illustrated, each aligned with a respective trough 8. The elongate bores 10 are connected via a conduit 12 to a reservoir 14 holding the solution to be deposited. The solution is supplied through the elongate bores 10 under pressure or by gravity to deposit the light emitting polymer layer 6.

Specific formulations according to the present invention are discussed herebelow.

Example 1

Figure 3A:
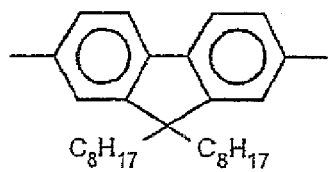
FIG. 3 shows the structure of recurring units and polymers used in the examples.
Figure 3B:
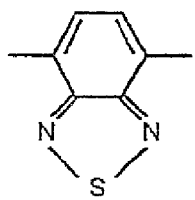
Figure 3C:
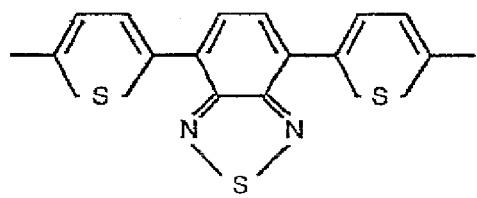
Figure 3D:
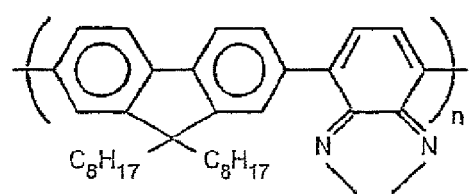
Figure 3E:
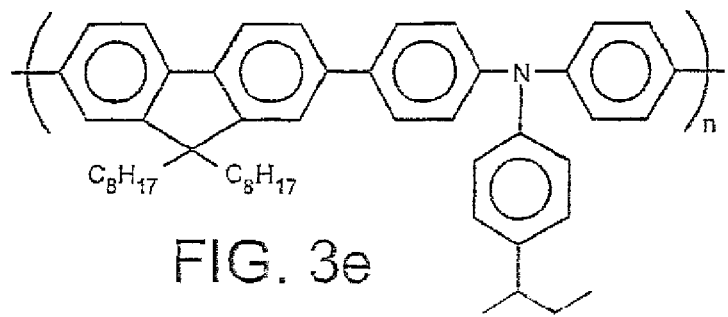

The first exemplified formulation is 1% w/v of a triblend containing approximately 14 wt. % of a ternary polymer containing fluorene (F8) units (shown in FIG. 3a), benzylthiadiazole (BT) units (shown in FIGS. 3b) and triarylene units shown in FIG. 3c, 56 wt. % of F8BT (shown in FIGS. 3d) and 30 wt. % TFB (shown in FIG. 3e) in 1,2,4 trirnethylbenzene. The resulting formulation had a viscosity of 3.8 cps at 20° C. and a surface tension of 28 mN/m at 20° C.

Example 2

According to the second example, the formulation comprises 1% w/v of the triblend referred to in Example 1 in a solvent mixture containing 20 vol. % 1,2,4-trimethylbenzene and 80 vol. % xylene. The formulation had a solution viscosity of 2.9 cps at 20° C. and a surface tension of 28 mN/m at 20° C.

A sample of the formulation was deposited on a substrate and was vacuum dried. The PL efficiency of the thus produced polymer layer was found to be 43%. Drying a layer of the same formulation at 80° C. for 13.5 hours resulted in a polymer layer having a PL efficiency of 39%.

Example 3

According to a third example, the formulation comprises 1% w/v of the triblend referred to in Example 1 in a solvent mixture containing 50 vol. % 1,2,4-trirnethylbenzene and 50 vol. % xylene. The formulation had a solution viscosity of 2.82 cps at 20° C. and a surface tension of 28 mN/m at 20° C.

The addition of the trimethyl benzene is found to significantly increase the stability of the formulation.

1,2-dimethyl benzene, 1,2,3-trimethylbenzene and 1,2,4-trimethylbenzene were also found to be good solvents for a fluorene-thiophene polymer having an average molecular weight of about 266,000.

What is claimed is:

1. A light-emissive device prepared by depositing a polymer layer on a substrate in the form of a conjugated, fluorene-based polymer dissolved in a solvent, the solvent including a dialkyl- or trialkyl-substituted aromatic hydrocarbon wherein at least two of the alkyl substituents are ortho to one another.

2. A light-emissive device according to claim 1 wherein the solvent includes a dialkyl- or trialkyl-substituted benzene wherein at least two of the alkyl substituents are ortho to one another.

3. A light-emissive device according to claim 2 wherein the solvent additionally comprises xylene.

4. A light-emissive according to claim 3 wherein the solvent comprises at least about 20% by weight of a trialkylbenzene and up to about 80% by weight of xylene.

5. A light-emissive device according to claim 2 wherein each alkyl substituent is independently selected from the group consisting of $C_1$ through $C_6$ alkyl groups.

6. A light-emissive device according to claim 1 wherein each alkyl substituent is a methyl group.

7. A light-emissive device according to claim 6 wherein the solvent includes 1,2-dimethylbenzene.

8. A light-emissive device according to claim 6 wherein the solvent includes 1,2,3-trimethylbenzene.

9. A light-emissive device according to claim 1 wherein the device comprises an organic light-emitting diode.

10. A light-emissive device according to claim 1 wherein the conjugated, fluorene-based polymer is a light-emissive polymer.

11. A light-emissive device according to claim 1 wherein the fluorene-based polymer includes a polymer containing triarylamine units.

12. A light-emissive device according to claim 1 wherein the fluorene-based polymer additionally comprises a polymer containing fluorene and triarylamine units.

13. A light-emissive device according to claim 1 wherein each alkyl substituent is independently selected from the group consisting of $C_1$ through $C_6$ alkyl groups.

14. A light-emissive device according to claim 1 wherein depositing the polymer layer on a substrate is performed using ink-jet printing.

* * * * *